United States Patent
Knausenberger et al.

(10) Patent No.: US 9,903,907 B2
(45) Date of Patent: Feb. 27, 2018

(54) ELECTRONIC SYSTEM AND METHOD FOR TESTING CAPACITIVE CIRCUIT LINES

(71) Applicant: Electrolux Appliances Aktiebolag, Stockholm (SE)

(72) Inventors: Martin Knausenberger, Rothenburg ob der Tauber (DE); Thibaut Rigolle, Forli (IT); Gianluca Venturini, Forli (IT); Henrike Hüther, Rothenburg ob der Tauber (DE); Friedrich Beck, Wechingen (DE)

(73) Assignee: Electrolux Appliances Aktiebolag, Stockholm (SE)

( * ) Notice: Subject to any disclaimer, the term of this patent is extended or adjusted under 35 U.S.C. 154(b) by 89 days.

(21) Appl. No.: 15/029,875

(22) PCT Filed: Dec. 9, 2014

(86) PCT No.: PCT/EP2014/077010
§ 371 (c)(1),
(2) Date: Apr. 15, 2016

(87) PCT Pub. No.: WO2015/091099
PCT Pub. Date: Jun. 25, 2015

(65) Prior Publication Data
US 2016/0252566 A1    Sep. 1, 2016

(30) Foreign Application Priority Data

Dec. 20, 2013 (EP) .................................... 13198845

(51) Int. Cl.
*G01R 33/36* (2006.01)
*G01R 31/28* (2006.01)
*G01R 31/02* (2006.01)

(52) U.S. Cl.
CPC ....... *G01R 31/2825* (2013.01); *G01R 31/024* (2013.01)

(58) Field of Classification Search
CPC .. G01R 33/5608; G01R 33/543; G01R 33/36; G01R 33/3614; G01R 33/3815;
(Continued)

(56) References Cited

U.S. PATENT DOCUMENTS

| | | |
|---|---|---|
| 4,504,782 A | 3/1985 | Zbinden |
| 4,907,230 A | 3/1990 | Heller et al. |

(Continued)

FOREIGN PATENT DOCUMENTS

| | | |
|---|---|---|
| EP | 2230528 A1 | 9/2010 |
| EP | 2312329 A1 | 4/2011 |

OTHER PUBLICATIONS

International Search Report issued in PCT/EP2014/077010 dated Mar. 13, 2015, 3 pages.

*Primary Examiner* — Jermele M Hollington
*Assistant Examiner* — Taqi Nasir
(74) *Attorney, Agent, or Firm* — Pearne & Gordon LLP

(57) ABSTRACT

The invention relates to an electronic system comprising a plurality of circuit lines and an error detection component for detecting errors on and between the plurality of circuit lines, wherein each circuit line having a voltage different to ground level, the error detection component being adapted to perform a test routine comprising the steps of: —selecting one circuit line out of the plurality of circuit lines; —determining the voltage of the selected circuit line and storing the voltage value; —discharging the selected circuit line to ground level; —iteratively repeating the aforementioned steps of selecting a circuit line, determining and storing its voltage and discharging for further circuit lines; —comparing the stored voltage values associated with the respective (Continued)

circuit lines with a threshold value; and —generating an error indicator if at least one stored voltage value is below the threshold value.

11 Claims, 2 Drawing Sheets

(58) Field of Classification Search
CPC ............ G01R 33/3875; G01R 33/5611; G01R 33/5659; G01R 33/3852; G01R 31/025; G01R 31/2896; G01R 33/288
USPC .... 324/537, 76.59, 322, 382, 406–408, 224, 324/750.3, 757.02, 762.02–763.01; 702/64, 65, 108, 117–121, 126, 182–185
See application file for complete search history.

(56) References Cited

U.S. PATENT DOCUMENTS

| | | | |
|---|---|---|---|
| 5,349,162 A | 9/1994 | Holling | |
| 5,781,559 A | 7/1998 | Muris et al. | |
| 6,885,211 B1 | 4/2005 | Thomsen et al. | |
| 8,166,362 B2* | 4/2012 | Meagher | G01R 31/3167 703/14 |
| 2002/0125890 A1 | 9/2002 | Kiribayashi et al. | |
| 2005/0248477 A1* | 11/2005 | Jongsma | H03M 1/1076 341/110 |
| 2010/0013512 A1* | 1/2010 | Hargan | G01R 31/2853 324/762.02 |
| 2010/0201373 A1* | 8/2010 | Sato | G01D 5/24461 324/537 |
| 2010/0244852 A1* | 9/2010 | Habu | G01R 31/3191 324/537 |
| 2011/0095766 A1* | 4/2011 | Ogle | G11B 19/048 324/537 |
| 2011/0148466 A1* | 6/2011 | Aton | H01L 27/0207 326/103 |

* cited by examiner

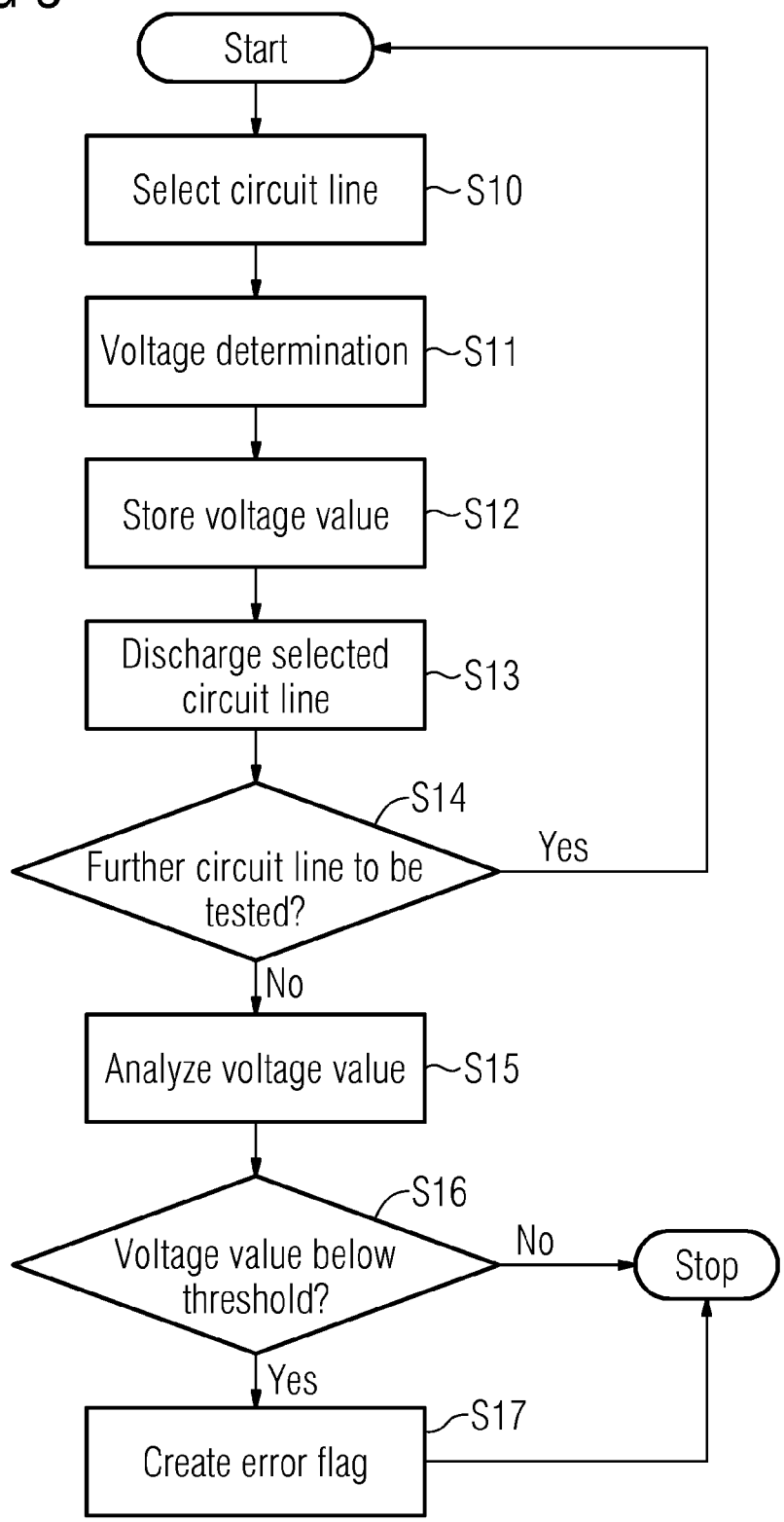

ELECTRONIC SYSTEM AND METHOD FOR TESTING CAPACITIVE CIRCUIT LINES

The present invention relates generally to the field of error detection. More specifically, the present invention is related to an electronic system and a method for testing circuit lines, specifically in household appliances.

BACKGROUND OF THE INVENTION

Electronic systems used in home appliance industry require compliancy of safety relevant norms, specifically norms related to safety-relevant signal handling (e.g. IEC/UL/CSA 60730).

Said electronic systems may comprise analog multiplexers in order to perform a time-dependent multiplex of a plurality of signals to a certain input of an electronic component, e.g. a microcontroller. Thereby, a plurality of signals can be connected to the electronic component which may provide a limited number of input ports.

In order to comply with the requirements of safety relevant norms, a common solution is to dedicate an input of each multiplexer used in the electronic system to a fixed reference signal. The reference signal may be a reference voltage having a preassigned value. By regularly sampling said reference signal the correct function of the electronic system can be tested.

A drawback of said common solution is that one input per each multiplexer is reserved for error detection. Thus, the number of available inputs is reduced and in certain configurations, further multiplexers are needed because of the reduced number of available multiplexer inputs.

Accordingly, there is a need for improvements of existing error detection methods in electronic systems in order to improve the utilization of the available hardware resources.

SUMMARY OF THE INVENTION

It is an objective of embodiments of the invention to provide for an electronic system with error detection and a method for detecting errors in electronic systems which show improved utilization of the available hardware resources. The objective is solved by the features of the independent claims. Preferred embodiments are given in the dependent claims. If not explicitly indicated otherwise, embodiments of the invention can be freely combined with each other.

According to a first aspect of the invention, the invention relates to an electronic system comprising a plurality of circuit lines and an error detection component for detecting errors on and between the plurality of circuit lines, wherein each circuit line having a voltage different to ground level, the error detection component being adapted to perform a test routine comprising the steps of:
  selecting one circuit line out of the plurality of circuit lines;
  determining the voltage of the selected circuit line and storing the voltage value;
  discharging the selected circuit line to ground level;
  iteratively repeating the aforementioned steps of selecting a circuit line, determining and storing its voltage and discharging for further circuit lines;
  comparing the stored voltage values associated with the respective circuit lines with a threshold value; and
  returning an error indicator if at least one stored voltage value is below the threshold value.

Specifically, the steps of comparing the stored voltage values with a threshold value and discharging the selected circuit line to ground level may at least partially overlap, i.e. may be at least partially performed simultaneously.

By performing the aforementioned test routine, it is possible to determine errors correlated with circuit lines without reserving a pin of the multiplexer for error detection. In addition it is possible to detect not only errors or faults on a certain circuit line but also between two circuit lines, e.g. neighbored circuit lines.

According to further embodiments, the circuit lines are lines comprising the inputs/outputs or a common output/input of a bidirectional multiplexer and the error detection component is adapted to select one certain circuit line by addressing the control inputs of the bidirectional multiplexer. Preferably, the bidirectional multiplexer comprises one common output/input line and a plurality of input/output lines to be connected to the common output/input line independently from each other by addressing control inputs of the bidirectional multiplexer. The common output/input line may be coupled with the error detection component. The error detection component may be implemented in a microcontroller. By a controlled addressing of the multiplexer, a plurality of different circuit lines may be analyzed.

According to further embodiments, the error detection component is adapted to perform an analog to digital conversion of the determined voltage value. Thereby it is possible to determine the voltage of the circuit line in the digital domain. In addition, the voltage value may be stored for further investigation in a memory provided by or connected with the error detection component.

According to further embodiments, the error detection component is adapted to discharge the selected circuit line by means of a pull-down transistor. Preferably, the error detection component is implemented by a microcontroller, wherein the discharging of the selected circuit line is performed by setting the pin of the microcontroller to digital low level. Thereby, the discharging of the circuit line can be obtained by switching the pin or port of the microcontroller connected to the circuit line to be analyzed to low level.

According to further embodiments, the error detection component is adapted to perform a value range check for determining if the voltage of the circuit line lies within a predetermined range. By using the value range check, for example, it is possible to determine if the voltage value of the selected circuit line is short-circuited to positive supply voltage.

According to further embodiments, the error detection component is adapted to perform the aforementioned test routine iteratively at least two times. Thereby it is possible to detect floating circuit lines with undefined potential, avoiding that floating circuit lines which coincidentally have a voltage value above the threshold value are deemed errorless.

According to a further aspect, the invention refers to a method for detecting errors on and between a plurality of circuit lines having a voltage different to ground level, the method comprising the following steps:
  selecting one circuit line out of the plurality of circuit lines;
  determining the voltage of the selected circuit line and storing the voltage value;
  discharging the selected circuit line to ground level;
  iteratively repeating the aforementioned steps of selecting a circuit line, determining and storing its voltage and discharging for further circuit lines;

comparing the stored voltage values associated with the respective circuit lines with a threshold value; and returning an error indicator if at least one stored voltage value is below the threshold value.

According to a third aspect, the invention refers to a computer-readable storage medium comprising instructions that, when executed by at least one processor of an appliance, cause the appliance to perform an operation for detecting errors on and between a plurality of circuit lines having a voltage different to ground level, the operation comprising the following steps:

selecting one circuit line out of the plurality of circuit lines;

determining the voltage of the selected circuit line and storing the voltage value;

discharging the selected circuit line to ground level;

iteratively repeating the aforementioned steps of selecting a circuit line, determining and storing its voltage and discharging for further circuit lines;

comparing the stored voltage values associated with the respective circuit lines with a threshold value; and generating an error indicator if at least one stored voltage value is below the threshold value.

The term "essentially" or "approximately" as used in the invention means deviations from the exact value by +/−10%, preferably by +/−5% and/or deviations in the form of changes that are insignificant for the function.

BRIEF DESCRIPTION OF THE DRAWINGS

The various aspects of the invention, including its particular features and advantages, will be readily understood from the following detailed description and the accompanying drawings, in which:

FIG. 3 shows an example flow chart of an embodiment of a test routine.

DETAILED DESCRIPTION OF PREFERRED EMBODIMENTS

Figure 1:
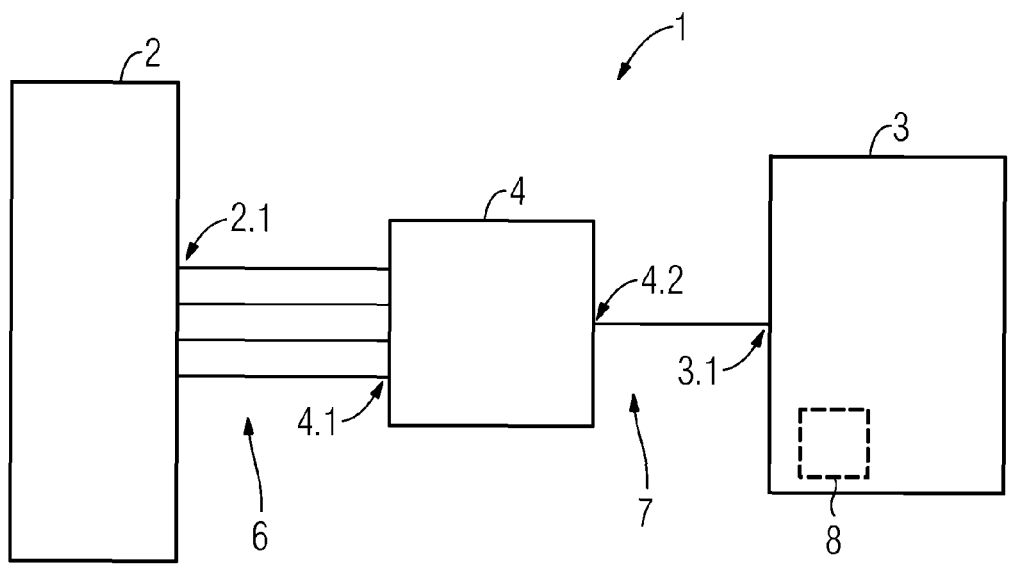
FIG. 1 shows an example schematic illustration of an electronic system according to the present invention.

The present invention will now be described more fully with reference to the accompanying drawings, in which example embodiments are shown. However, this invention should not be construed as limited to the embodiments set forth herein. Throughout the following description similar reference numerals have been used to denote similar elements, parts, items or features, when applicable.

FIG. 1 illustrates an embodiment of an electronic system 1. The electronic system 1 comprises a capacitive-type value generating component 2. The value generating component 2 may be any capacitive-type component which is adapted to provide measureable values, specifically electrical values. For example, the value generating component 2 may be a capacitive-type touch pad comprising a plurality of touch buttons, wherein the touch pad may provide a voltage value correlated to the respective touch button dependent on the touching status (touched or not). According to a further example, the value generating component 2 may be a temperature regulating and limiting control comprising multiple analog temperature sensors (e.g. NTC-type), wherein the voltage dropped over the temperature sensor is indicative for the temperature of the temperature sensor.

The value generating component 2 may be connected to a microcontroller 3 comprising a set of pins 3.1. Said pins 3.1 may be preferably analog inputs and digital outputs wherein the functionality of the pins depends on a control signal applied to the microcontroller 3. For analyzing the electrical values provided by the value generating component 2, each output 2.1 of the value generating component 2 has to be connected to a pin 3.1 of the microcontroller 3 to analyze the electrical value provided by the value generating component 2.

In case that the number of pins 3.1 of the microcontroller 3 is lower than the number of outputs 2.1 provided by the value generating component 2, a multiplexer 4 is used for multiplexing multiple outputs 2.1 to one pin 3.1 of the microcontroller 3.

Figure 2:
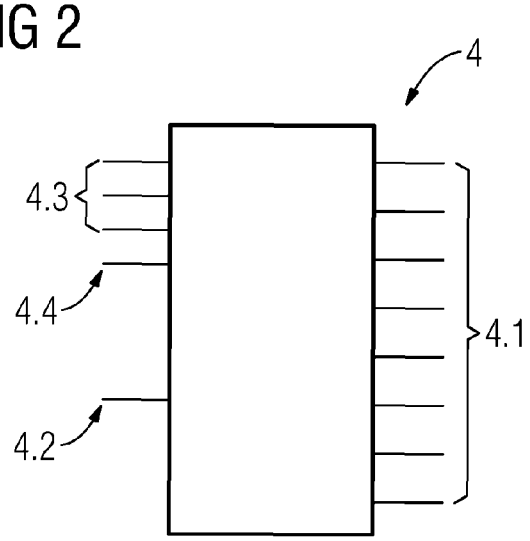
FIG. 2 shows an example schematic illustration of a multiplexer implemented in the electronic system according to FIG. 1.

FIG. 2 shows an example embodiment of a multiplexer 4 to be used in an electronic system 1. The shown multiplexer 4 may be an 8-to-1 multiplexer which is adapted to switch the electrical signal provided at one of the eight inputs 4.1 to a common output 4.2 based on a control signal provided to the multiplexer 4. So, at a certain point of time, a certain input 4.1 is connected to the output 4.2 of the multiplexer 4 allowing a time-dependent analysis of the electrical value provided by the value generating component 2 by means of the microcontroller 3.

The multiplexer 4 may be a bidirectional multiplexer, i.e. the multiplexer 4 may be also be operated in the inverse direction, wherein the common output 4.2 serves as input and the multiple inputs 4.1 serves as outputs 4.2. Hence, the inputs 4.1 may be also referred to as inputs/outputs 4.1 and the common output 4.2 may be also referred to as common output/input 4.2.

The multiplexer 4 may further comprise a set of control inputs 4.3 enabling an addressing of the multiplexer such that a certain input/output 4.1 is electrically connected to the common output/input 4.2. Thereby a controlled switching according to a scheduling is possible. The multiplexer 4 may further comprise an inhibit input 4.4 to simultaneously disable the switches of the multiplexer 4 when a high-level (e.g. 5V) is applied to the inhibit input 4.4.

In order to comply with the aforementioned safety relevant norms of electronic systems used in the home appliance industry (IEC/UL/CSA 60730), error detection is required.

Said error detection may be adapted for detecting:

short circuits of the circuit lines 6, 7 connected to the multiplexer 4 to ground, i.e. zero potential;

short circuits of the circuit lines 6, 7 connected to the multiplexer 4 to positive supply voltage (+Vcc) or to negative supply voltage (−Vcc);

short circuits to neighboring circuit lines or pins;

open circuits leading to a floating potential;

wrong addressing of the multiplexer due to errors at the control inputs or circuit lines connected to the control inputs.

For detecting the aforementioned errors, a test routine comprising consecutive steps is performed. The test routine may be implemented in an error detection component 8. Said error detection component 8 may be integrated in the microcontroller 3. According to a further embodiment, the error detection component 8 may be implemented as a self-contained component independent from the microcontroller 3. Furthermore, the error detection component 8 may be implemented at least partially in software.

For performing the test routine for error detection, the following requirements may be fulfilled:

The voltage of the circuit lines 6, 7 before starting the test routine is different to 0V, i.e. different to ground or zero potential. The circuit lines 6, 7 connected to the value generating component 2 may be charged at a voltage, e.g. a voltage of 3.0V-4.0V, specifically 3.7V, because the capacity-type value generating component 2 is working at said voltage in normal operation.

The circuit lines 6, 7 and the value generating component 2 can be electrically discharged to 0V, i.e. ground or zero potential. Said discharging may be performed by means of a pull-down transistor connected to ground; after discharging to 0V, the voltage of the circuit lines 6, 7 stay at 0V or essentially 0V.

In the following, the test routine is described based on the flow diagram shown in FIG. 3. The test routine may be performed by the error detection component 8 which is preferably integrated in the microcontroller 3. After starting the test routine, in a first step, a circuit line 6, 7 is selected (S10). In case that a circuit line 6 comprising one of the plurality of inputs/outputs 4.1 should be tested, the control inputs 4.3 are driven such, that the chosen input/output 4.1 is connected to the common output 4.2 of the multiplexer 4. The microcontroller 3 may be controlled such that the pin 3.1 of the microcontroller 3 connected to the common output 4.2 of the multiplexer 4 is set as analog input, i.e. the signal provided at the pin 3.1 is analyzed.

Subsequently, the voltage of the selected circuit line is determined (S11). Said determination may be performed by measuring means of the microcontroller 3. Preferably, the analog signal provided at the pin 3.1 is converted from the analog into the digital domain by means of an analog-to-digital converter (A/D-converter). Following up, the digital voltage value is stored (S12).

In the following step, the selected circuit line is discharged to ground level (0V) (S13). Said discharging may be performed by means of the microcontroller 3. Specifically, the pin 3.1 may be set to low level by controlling the microcontroller 3 in the appropriate way. Thereby, the capacitor correlated with the selected circuit line is discharged. Preferably, a pull-down transistor may be used for discharging the circuit line. The period of time needed for discharging depends on the R-C time constant, so discharging of the circuit line takes a certain period of time (e.g. 1 ms-100 ms).

Following up in the test routine, there is a check whether any further circuit lines have to be tested (S14). If so, the test routine starts again at step S10, i.e. a further circuit line to be tested is selected. Otherwise, if there are no further circuit lines to be tested, the at least one stored voltage value is analyzed (S15). If at least one of the stored voltage values is below a certain threshold value (e.g. <0.1V) (S16), an error flag is generated (S17) indicating a failure within the tested electronic system 1 because a correctly configured and fully working electronic system 1 should give back only values above the predefined threshold value.

In addition, a value range test may be performed. By means of the value range test it is possible to detect untypical deviations from typical measurement values. Specifically, it is possible to detect an overshooting or undershooting of typical measurement values. For performing the value range test, the voltage values of the respective circuit lines may be checked by analog-to-digital conversion and analyzing the digital voltage values, if the voltage values are in the desired range.

In the following, different error scenarios which may be detected by the aforementioned test routine are described in closer detail.

Based on the test routine, an error in a circuit line comprising one of the control input pins 4.3 may be detected. In general, a error in a circuit line comprising one of the control input pins 4.3 may lead to a wrong addressing. Due to wrong addressing, a circuit line may be selected and analyzed twice, i.e. an already tested and therefore discharged circuit line may be tested again. Thus, during the further test routine, a voltage level below the threshold value may be detected. Thus, an error flag may be generated indicating an error in the respective circuit line.

Also short circuits of the circuit lines containing the inputs/outputs 4.1 of the multiplexer 4 to ground may lead to a detected voltage below the threshold value and therefore lead to a generation of an error flag. In addition, also short circuits of inputs/outputs 4.1 to neighboring pins of the multiplexer may be detected because discharging of one of the short-circuited lines may lead also to a discharge of the further circuit line. When determining the voltage of said further circuit line, a voltage below the threshold value is detected leading to a generation of an error flag.

Even open circuit lines, e.g. broken circuit lines, may be detected by means of the upper-mentioned test routine. An open circuit line may be floating, i.e. the voltage value may be not defined. Therefore, a value range check may not reliably detect an error when analyzing a floating pin. By performing said test routine, the floating circuit line may be connected with the discharged input of the A/D-converter leading to a discharging of the floating circuit line. Therefore, in order to detect all floating circuit lines it is possible to perform the test routine twice. Preferably, the test routine is performed in different directions and/or different order. Preferably the test routine is performed regularly, namely in a first step in a forward direction and in a second step in a backward direction wherein between both steps normal operation is performed in order to ensure that the circuit lines 6, 7 comprise the normal operation voltage.

Similarly, also errors regarding the circuit lines comprising the multiplexer output 4.2 or the inhibit input 4.4 may be detected.

Above, embodiments of the electronic system according to the present invention as defined in the appended claims have been described. These should be seen as merely non-limiting examples. As understood by a skilled person, many modifications and alternative embodiments are possible within the scope of the invention.

LIST OF REFERENCE NUMERALS

| | |
|---|---|
| 1 | electronic system |
| 2 | value generating component |
| 2.1 | output |
| 3 | microcontroller |
| 3.1 | pin |
| 4 | multiplexer |
| 4.1 | input |
| 4.2 | output |
| 4.3 | control input |
| 4.4 | inhibit input |
| 5 | control input |
| 6 | circuit line |
| 7 | circuit line |
| 8 | error detection component |

The invention claimed is:

1. Electronic system comprising a plurality of circuit lines and an error detection component for detecting errors on and between the plurality of circuit lines, wherein each circuit line has a voltage different from ground level, the error detection component being adapted to perform a test routine comprising the steps of:
- selecting one circuit line out of the plurality of circuit lines;
- determining the voltage of the selected circuit line and storing the voltage value;
- discharging the selected circuit line to ground level;
- iteratively repeating the aforementioned steps of selecting a circuit line, determining and storing its voltage and discharging for further ones of the circuit lines;
- comparing the stored voltage values associated with the respective circuit lines with a threshold value; and
- generating an error indicator if at least one stored voltage value is below the threshold value.

2. Electronic system according to claim 1, wherein the circuit lines are lines comprising the inputs/outputs or a common output/input of a bidirectional multiplexer and the error detection component is adapted to select one certain circuit line by addressing the control inputs of the bidirectional multiplexer.

3. Electronic system according to claim 1, wherein the error detection component is adapted to perform an analog to digital conversion of the determined voltage value.

4. Electronic system according to claim 1, wherein the error detection component is adapted to discharge the selected circuit line by means of a pull-down transistor.

5. Electronic system according to claim 1, wherein the error detection component is implemented by a microcontroller, wherein the discharge of the selected circuit line is performed by setting a pin of the microcontroller to digital low level.

6. Electronic system according to claim 1, wherein the error detection component is adapted to perform a value range check for determining if the voltage of the selected circuit line lies within a predetermined range.

7. Electronic system according to claim 6, wherein the error detection component is adapted to perform the test routine iteratively at least two times in order to detect floating circuit lines.

8. Electronic system according to claim 1, wherein the steps of comparing the stored voltage values with a threshold value and discharging the selected circuit line to ground level are at least partially performed simultaneously.

9. Domestic appliance comprising an electronic system according to claim 1.

10. Method for detecting errors on and between a plurality of circuit lines having a voltage different from ground level, the method comprising the following steps:
- selecting one circuit line out of the plurality of circuit lines;
- determining the voltage of the selected circuit line and storing the voltage value;
- discharging the selected circuit line to ground level;
- iteratively repeating the aforementioned steps of selecting a circuit line, determining and storing its voltage and discharging for further ones of the circuit lines;
- comparing the stored voltage values associated with the respective circuit lines with a threshold value; and
- returning an error indicator if at least one stored voltage value is below the threshold value.

11. A computer-readable storage medium comprising instructions that, when executed by at least one processor of an appliance, cause the appliance to perform an operation for detecting errors on and between a plurality of circuit lines having a voltage different from ground level, the operation comprising the following steps:
- selecting one circuit line out of the plurality of circuit lines;
- determining the voltage of the selected circuit line and storing the voltage value;
- discharging the selected circuit line to ground level;
- iteratively repeating the aforementioned steps of selecting a circuit line, determining and storing its voltage and discharging for further ones of the circuit lines;
- comparing the stored voltage values associated with the respective circuit lines with a threshold value; and
- generating an error indicator if at least one stored voltage value is below the threshold value.

* * * * *